United States Patent [19]

Cotreau

[11] Patent Number: 4,783,637

[45] Date of Patent: Nov. 8, 1988

[54] FRONT END STAGE OF AN OPERATIONAL AMPLIFIER

[75] Inventor: Gerald M. Cotreau, Melbourne, Fla.

[73] Assignee: Harris Corporation, Melbourne, Fla.

[21] Appl. No.: 917,441

[22] Filed: Oct. 7, 1986

Related U.S. Application Data

[63] Continuation-in-part of Ser. No. 782,690, Oct. 1, 1985, Pat. No. 4,636,743.

[51] Int. Cl.$^4$ .......................... H03F 3/45; H03F 3/68
[52] U.S. Cl. .................................... 330/295; 330/255; 330/257; 330/261
[58] Field of Search ................. 330/124 R, 252, 255, 330/257, 261, 263, 268, 296, 297, 295

[56] References Cited

U.S. PATENT DOCUMENTS

| | | | |
|---|---|---|---|
| 3,801,858 | 7/1974 | Grangaard | 330/124 X |
| 3,922,614 | 11/1975 | Van De Plassche | 330/257 |
| 4,227,256 | 10/1980 | O'Keefe | 330/295 X |
| 4,236,120 | 11/1980 | White | 330/297 X |
| 4,240,040 | 12/1980 | Saari | 330/255 |
| 4,250,460 | 2/1981 | Gasparik | 330/252 |
| 4,390,850 | 6/1983 | Davis et al. | 330/253 |
| 4,446,443 | 5/1984 | Johnson et al. | 330/257 |
| 4,531,099 | 7/1985 | Nakane | 330/297 X |

Primary Examiner—James B. Mullins
Attorney, Agent, or Firm—William A. Troner; Charles C. Krawczyk

[57] ABSTRACT

The front end of an operational amplifier having an improved slew rate and high gain current output capabilities. The amplifier includes a slew enhancement or large signal stage connected in parallel to a normal front end or small signal stage. The small signal stage supplies a transconductance output which is approximately linearly related to the input until its slew rate limit. The slew enhancement stage is designed to provide slew current when the small signal stage reaches a selected threshold such as its slew rate limit, thereby providing an increased output current response to an increasing differential input voltage beyond the slew rate of the small signal stage. The large signal stage can be optimized to provide a greater input linear dynamic range, faster slew rate and improved efficiency.

16 Claims, 3 Drawing Sheets

FRONT END STAGE OF AN OPERATIONAL AMPLIFIER

This is a continuation in part to the application Ser. No. 782,690, filed Oct. 1, 1985, now U.S. Pat. No. 4,636,743.

BACKGROUND AND SUMMARY OF THE INVENTION

The present invention relates to an operational amplifier circuit, and more particularly to an improved front end stage of an operational amplifier having increased transconductance gain and improved slew rate characteristics.

Generally, the output current of the front end stage corresponds to a hyperbolic tangent with the input differential voltage. However, for input voltages greater than a certain magnitude, slew rate limiting occurs with the output current being equal in magnitude to that of the current sources for the front end stage, thereby resulting in no further increase in output current with increases in input differential voltages. Additionally, the maximum slew rate at which the output is responsive to the input is limited in order to assure amplifier stability and minimum requirements in transconductance gain. Although various techniques have been developed to either extend the range of the output current beyond the slew rate limit or to improve the slew rate and output capabilities, these techniques result in adversely affecting other related characteristics of the amplifier such as transconductance gain, offset voltage, power dissipation and temperature coefficients.

According, it is an object of this invention to provide an improved amplifier with an improved slew rate without adversely effecting the other characteristics of the front end stage of the amplifier.

It is further an object of this invention to provide an improved amplifier with high gain capabilities.

It is another object to provide a new and useful technique for increasing both the slew rate and current output capabilities of the front end stage without adversely effecting other related characteristics of the amplifier.

It is still another object to provide an improved amplifier having an increased region over which the output current of the transconductance stage of the amplifier is responsive to a differential input voltage.

It is still a further object to provide an improved amplifier having increased power efficiency without sacrificing slew rate or amplifier gain.

These and other objects are attained by providing a large signal or slew enhancement stage connected in parallel to a small signal or front end stage of an operational amplifier, thereby improving both the slew rate and transconductance gain of the amplifier while also providing the capability of extending the linear dynamic range of the front end stage output.

The small signal stage includes at least one differential transistor pair, with each pair having a differential input and a single output. The large signal stage includes a complementary set of differential transistor pairs, a pair of active loads and corresponding output stages. The large signal stage further includes means for setting the large signal stage transconductance and current gain. Additionally, the large signal stage includes a means for biasing the stage such that it remains electrically decoupled from the front end stage until the differential input voltage reaches a threshold set by the circuit designer.

Depending upon the polarity of the input differential voltage, the small signal stage functions as either a high gain current source or current sink for a subsequent stage of the amplifier. Prior to the small signal stage reaching a selected threshold voltage, such as its slew rate limit, the large signal stage will be decoupled from the small signal stage such that no additional current is provided to the front end stage by the large signal stage. Upon the small signal stage reaching the selected threshold, however, one of the complementary sections of the large signal stage will either serve as an additional current source or current sink to the output of the front end stage. Which complementary section will conduct depends upon the polarity of the differential voltage applied to the parallel inputs of the differential transistor pairs. The threshold voltage at which the large signal stage begins to deliver output current is set by the circuit designer and will usually be set to equal the point at which the small signal stage begins to slew rate limit.

Because the large signal stage is decoupled during small signal operation, thereby providing slewing current only when needed in large signal operation, the small signal characteristics such as the settling time are not adversely affected by the large signal stage. Additionally, by adjusting the transconductance and current gain parameters of the large signal stage, the parallel stage can be made to emphasize extending the linear dynamic range of the front end stage output, or providing a fast slew rate with power efficiency.

These and other objects, advantages and novel features of the present invention will become apparent from the following detailed description of the invention when considered in conjunction with the accompanying drawings.

DETAILED DESCRIPTION OF THE DRAWINGS

Figure 1:
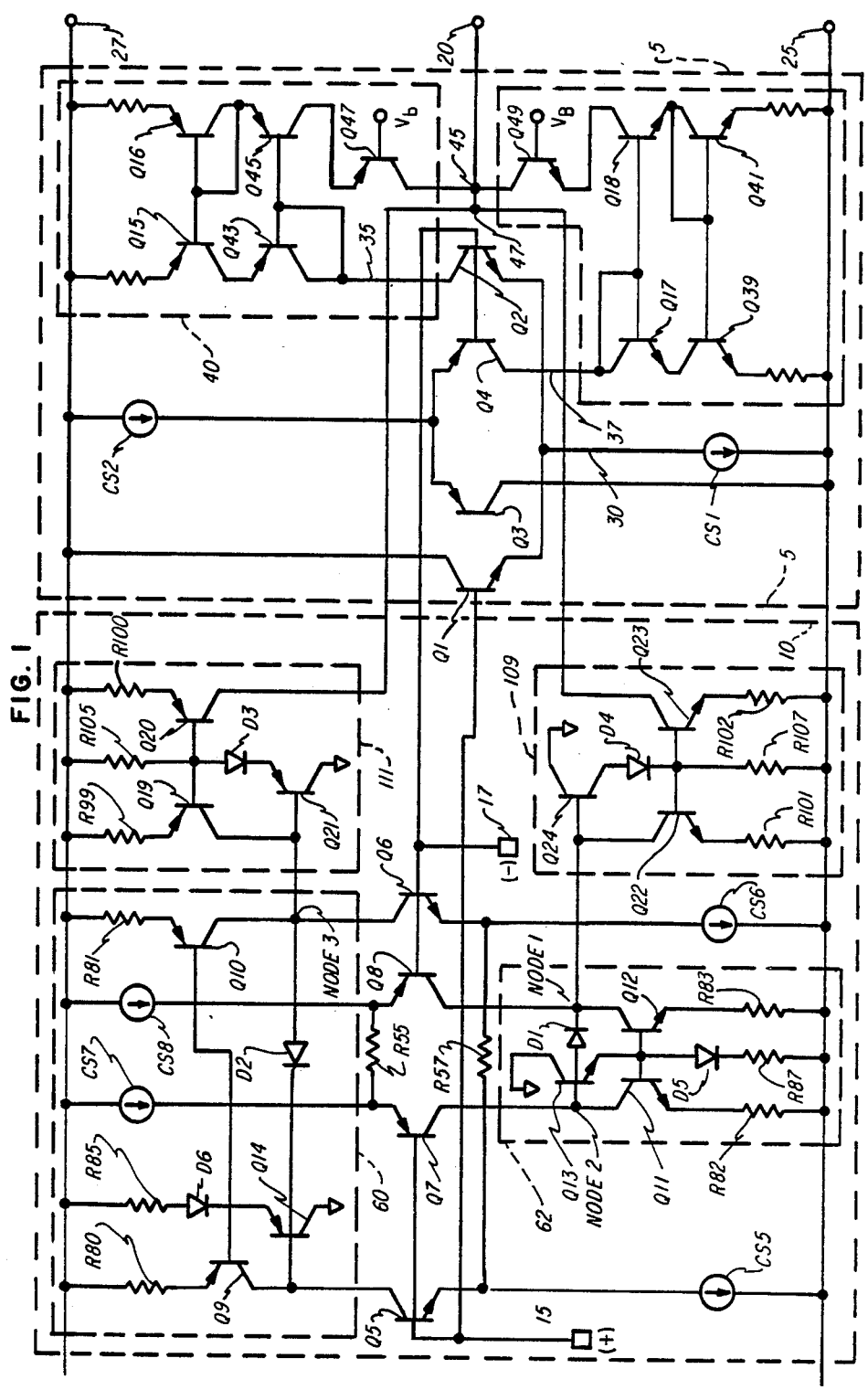
FIG. 1 represents a schematic diagram of the slew enhancement or large signal stage in parallel with a normal front end stage of an operational amplifier incorporating the principles of the present invention.

Referring to FIG. 1, the front end or small signal stage 5 is shown connected in parallel to a large signal or slew enhancement stage 10, the two stages embodying various aspects of the invention. The combined stages have two input terminals for receiving a differential input voltage, one of the terminals being designated as positive 15 and the other terminal being designated as negative 17. The circuit shown also has a pair of summing node 45 and 47, each communicating with the other to form a single output 20, whereby current will either flow into the output 20 from an additional stage not shown or will flow out at the output 20 into the additional stage. The direction of the current depends upon the polarity of the input differential voltage at 15 and 17, with the magnitude of the current corresponding to the magnitude of the voltage differential at the input.

The small signal stage 5 includes two differential transistor pairs, one pair consisting of NPN transistors $Q_1$, $Q_2$ and the other pair of PNP transistors $Q_3$, $Q_4$. The positive input terminal 15 is coupled to the bases of complementary transistor $Q_1$ and $Q_3$ while the negative input terminal 17 is coupled to the bases of complementary transistors $Q_2$ and $Q_4$, thereby forming NPN and PNP differential inputs.

Current sources CS1 and CS2 are coupled in between the common emitters 30 and 31 of the respective transistor pairs and the respective supply rails 25 and 27. These current sources should be closely matched for minimizing the offset voltage of the amplifier. The collector legs of the transistors $Q_1$ and $Q_3$ are coupled to supply rails 27 and 25 respectively. The other two collector legs of $Q_2$ and $Q_4$ function as the outputs 35 and 37 of the transistor pairs respectively. These outputs are coupled to a summing node 45 respectively via current mirror pairs 40 and 42. The current mirror pairs, with each mirror having a one to one ratio, reflect the respective output current of the transistor pairs to the summing node 45. The small signal stage parameters are optimized for small signal operation such that settling time of the output signal is minimized.

Depending upon the polarity of the differential input voltage the output of the small signal stage will be derived predominantly from one of the differential transistor pairs and their respective current mirror pairs. Thus for an input differential voltage in which the positive terminal 15 is more positive than the negative terminal 17, the PNP transistor pair $Q_3$ and $Q_4$ will be biased such that the current mirrors 42 are driven at $Q_{17}$ and $Q_{39}$, thereby creating a reflected current in $Q_{18}$ and $Q_{41}$. The current provided to the reflecting legs of current mirror pairs 42 will originate from a succeeding stage not shown, and flow into the output 20 at node 45 and down to the lower supply rail 25 via $Q_{49}$, $Q_{18}$, and $Q_{41}$. For the opposite polarity applied at the differential inputs, the NPN transistor pair $Q_1$ and $Q_2$ will be biased such that $Q_2$ draws in current from the supply rail 27 through the respective current mirror transistors $Q_{16}$, $Q_{45}$ and $Q_{47}$ to the summing node 45 leading to the output 20. By having two current mirrors at the outputs of the differential pairs, base current cancellation mirrors at the outputs of the differential pairs, base current cancellation results at the high impedance node 45, thereby producing reduced dc offset voltages of the small signal stage. Common base transistors $Q_{47}$ and $Q_{49}$ are arranged between the collectors legs of $Q_{45}$ and $Q_{18}$ respectively, to compensated for the base current of $Q_4$ and $Q_2$ respectively. The base voltage Vb is supplied by a control dc voltage source.

With respect to FIG. 1, the large signal or slew enhancement stage 10 includes an input stage comprising two differential transistor pairs, one pair consisting of NPN transistors, $Q_5$ and $Q_6$ and the other pair consisting of PNP transistors $Q_7$ and $Q_8$. Similar to the small signal stage 5, the positive input terminal 15 is coupled to the bases of complementary transistors $Q_5$ and $Q_7$, with the negative terminal 17 coupled to the bases of complementary transistors $Q_6$ and $Q_8$. The inputs are in turn connected in parallel to the corresponding like pair of inputs of the small signal stage 5. Also similar to the small signal stage, the differential pairs of the large signal stage will either cause its output to supply or sink current, depending upon the polarity of the differential input voltage. The large signal stage will thus produce an output current corresponding to the polarity and magnitude of the differential input voltage.

Each differential pair has its emitters connected to a supply rail, via a current source in each leg respectively. Current Sources CS5 and CS6 are connected to the emitters of $Q_5$ and $Q_6$ respectively while currents CS7 and CS8 are connected to the emitters of $Q_7$ and $Q_8$ respectively.

Resistors 55 and 57 are coupled across the emitters of $Q_7$, $Q_8$, and $Q_5$, $Q_6$ respectively and provide the means for setting the transconductance of the large signal stage 10. Active loads are provided at the the collector legs of $Q_5$, $Q_6$ and $Q_7$, $Q_8$ respectively. These active loads include current mirrors comprised of either PNP transistor pair $Q_9$ and $Q_{10}$ or NPN transistor pair $Q_{11}$ and $Q_{12}$, the former being coupled to the NPN differential pair $Q_5$ and $Q_6$ and the latter being coupled to the PNP differential pair $Q_7$ and $Q_8$. Resistors 80, 81, 82 and 83 are coupled between the emitters of the respective transistor in the active loads and one of the supply rails. The resistance value of these four resistors are chosen such that there is a slight gain in the mirrored current of the output of the active loads, with this output being taken at the collectors of transistors $Q_{10}$ and $Q_{12}$ respectively.

Transistors $Q_{13}$ and $Q_{14}$ in conjunction with diodes D1 and D2, respectively, are coupled between the collectors of their respective active loads 60 and 62. Diodes D1 and D2 serve to clamp transistors $Q_{12}$ and $Q_{10}$ respectively at nodes 1 and 3. They also in conjunction with the respective transistors $Q_{13}$ and $Q_{14}$ prevent $Q_{12}$ and $Q_{10}$ from saturating when in operation.

The base of $Q_{13}$ is connected to both the anode of $D_1$ and the collectors of $Q_7$ and $Q_{11}$, while the collector of $Q_{13}$ is grounded. The cathode of $D_1$ is connected to the collectors of $Q_8$ and $Q_{12}$ and to the input of an output stage 109. Diode $D_5$ is coupled between the emitter of $Q_{13}$ and the lower supply rail 25 via resistance 87. Resistors 82 and 83 are coupled between the respective emitters of $Q_{11}$ and $Q_{12}$ and the supply rail 25.

In similar fashion, the base of $Q_{14}$ is connected to the cathode of $D_2$ and the collectors of $Q_5$ and $Q_9$, while the collector $Q_{14}$ is grounded. The anode of $D_2$ is connected to the collectors of $Q_6$ and $Q_{10}$ and to the input of its output stage 111. Diode $D_6$ is coupled between the emitter of $Q_{14}$ and the upper supply rail 27 via resistance 85. Resistors 80 and 81 are coupled between the respective emitters of $Q_9$ and $Q_{10}$ and the supply rail 27.

The output stages 109 and 111 are shown as high gain current mirrors and combine the output and current gain functions. These stages 109 and 111 include an NPN transistor pair $Q_{22}$ $Q_{23}$ and an PNP transistor pair $Q_{19}$ and $Q_{20}$ respectively, each pair having its input coupled to the output of its corresponding active loads 60, 62. The current mirror outputs are coupled to the summing node 47 where current provided by or to the current mirrors of the large signal stage 10 is combined with the current output from the small signal stage 5, for providing a total current at the output 20 of the circuit.

The transistors $Q_{21}$ and $Q_{24}$ and respective series diode $D_3$ and $D_4$ of the respective current mirrors 111 and 109, are connected across the collectors and bases of $Q_{19}$ and $Q_{22}$ respectively. The collectors of transistors $Q_{21}$ and $Q_{24}$ are connected to ground.

Resistors 101 and 102 of the current mirror 109 are coupled between the lower supply rail 25 and the emitters of $Q_{22}$ and $Q_{23}$ respectively. For attaining the most accurate current gain set by the high gain current mirror 109, the emitters of $Q_{22}$ and $Q_{23}$ should have substantially the same ratio as resistors 102 and 101. The bases of $Q_{22}$ and $Q_{23}$ are coupled to each other and to the cathode of $D_4$ and the supply rail 25 via resistance 107. The collector of $Q_{22}$ is connected to the output of the active load 62 at the node 1 and also to the base of $Q_{24}$. The collector of $Q_{23}$ is connected to the output 20 via summing node 47.

In similar fashion, resistors 99 and 100 of the current mirror means 111 are coupled between the upper supply rail 27 and the emitters of $Q_{19}$ and $Q_{20}$ respectively. Also for attaining accurate current gain set by the current mirror 111, the emitters of $Q_{19}$ and $Q_{20}$ should have substantially the same ratio as resistors 100 and 99. The bases of $Q_{19}$ and $Q_{20}$ are coupled to each other and to the anode of $D_3$ and the supply rail 27 via resistance 105. The collector of $Q_{19}$ is connected to the output of the active load 60 and also to the base of $Q_{21}$. The collector of $Q_{20}$ is connected to the output 20 via summing node 47.

For ease of discussion, the following explanation of the large signal stage operation will focus on only the lower half of the circuit as it responds to varying polarity of differential input voltages. The other half of the circuit, however, responds in a like manner with respect to input voltages which are of the opposite polarity to those discussed below. Also both lower and upper halves of the large signal stage respond similarly under balanced conditions.

Under balanced conditions, corresponding to the same voltage potential being applied at both inputs 15 and 17, transistors $Q_7$ and $Q_8$ of the large signal stage 10 conducts with equal currents flowing through them. Because the current mirror of the active load 62 is made to have a slight gain resulting from resistor 82 having a slightly larger resistance value than resistor 83, the transistor $Q_{12}$ pulls more current than the transistor $Q_{11}$. This causes the voltage at the node 1 to fall toward the potential of the lower supply rail 25, until $D_1$ clamps thereby preventing $Q_{12}$ from saturating. Under these conditions, the high gain current mirror 109 is biased in a nonconductive state.

Transistor $Q_{13}$ is used to bridge the base-collector of the current mirror input device $Q_{11}$, instead of a short circuit, in order to bring the voltage up one diode at node 1 to compensate for the voltage drop of the clamping diode $D_1$; otherwise $Q_{12}$ would go into saturation. The combination of diode drops of the base-emitter junction of $Q_{13}$ and $D_1$ provide the same voltage at both the collector and base of $Q_{12}$, thereby preventing $Q_{12}$ from saturating under balanced conditions. Current flowing through $Q_{12}$ will be equal to that flowing through $Q_{11}$ increased by the slight gain of the active load 62, the gain being equal to the value of resistor 82 divided by the value of resistor 83.

Also under these balanced conditions, the voltage at node 2 will be equivalent to the voltage across two diodes (Vbe of $Q_{13}$, $Q_{11}$) and across the resistance 82 above supply potential at 25, while the voltage at node 1 will be one diode drop down from node 2 due to the conducting of diode $D_1$. Because the high gain current mirror 109 requires at least a potential equivalent to three diode drops above rail 25 at node 1 in order for it to conduct, it will remain off and the current at the output of the circuit 20 will only be that of the small signal stage 5.

When the potential becomes more positive at the input 17 with respect to the input 15, the high gain current mirror 109 remains off, although the current mirror 111 in the other half of the large signal stage will begin to conduct. As the voltage differential becomes more positive at input 17, $Q_7$ is biased on more than $Q_8$. This results in the current from the current source CS8, which normally flows into the emitter of $Q_8$ under balanced conditions being diverted through resistor 55 and to the emitter of $Q_7$. The current flowing out of the collector of $Q_7$ will continue to maintain the voltage at nodes 1 at relatively the same potential as under balanced conditions, with $D_1$ and $Q_{11}$ conducting approximately equal currents with $D_1$ continuing to clamp $Q_{12}$ at node 1. This will also continue to maintain the high gain current mirror 109 of this half of the circuit in a nonconductive state.

When the potential becomes more positive at the input 15 with respect to input 17, the high gain current mirror 109 will begin to conduct at a selected potential determined by the ratio of the resistance values of 82 and 83. As the voltage differential increases in this polarity, $Q_8$ begins to conduct more than $Q_7$ through resistance 55 and adding to current already flowing through $Q_8$ from current source CS8. As a result, the current flowing from the collector of $Q_8$ will be larger than the current flowing from the collector of $Q_7$. As the current from $Q_8$ increases to equal the current through $Q_{12}$, the clamping diode $D_1$ will turn off. A further increase in the differential voltage at this point will cause the high gain current mirror 109 to turn on, the voltage at node 1 increasing sufficiently to allow $Q_{22}$ to conduct with a reflected current resulting in $Q_{23}$. The reflected current will have a gain equal to the ratio of resistance values of resistors 101 and 102.

The amplified current provided by the high gain current mirror 109 is communicated to the summing node 47 where it is combined with the small signal stage output at summing node 45 to produce the current output of the circuit 20.

The period under which the high gain mirror is nonconductive is determined by the ratio of resistance values 82 and 83 and is thus a controllable variable. This period is generally referred to as the "dead zone". By choosing the ratio of emitter resistances of the respective active loads to cause the high gain current mirrors of the respective halves of the large signal stage to begin conducting respectively when the small signal stage begins to slew rate limit, and by choosing the large signal stage transconductance setting resistors 55 and 57 so that the transconductance of the large signal stage matches that of the small signal stage, the total output current of the circuit will reflect an approximate linear transconductance response to an increasing differential input voltage beyond the slew rate limit of the small signal stage. Thus, the front end stage will have an extended linear dynamic range of overall output current.

Alternatively, by setting resistors 55 and 57 for providing a higher transconductance relative to the small signal stage, the front end stage can be adjusted for improved slew rate and power efficiency. Additionally, the current sources of the large signal stage; CS7, CS8, CS5, CS6, and the gain of the high gain current mirrors, 109 and 111, may also be adjusted for increasing the slew rate and power efficiency. For example, the current sources can be designed to provide a low supply of current and the gain of the high gain current mirrors can be set high. When in balanced condition, the current draw of the front end stage is only from the low supply current sources of the large and small signal stages. In a slewing mode condition, however, the large signal stage will draw current from the power supply rails 25 and 27 through the respective high gain current mirrors 109 and 111, thereby providing an amplified current to achieve the desired fast slew rate. As a result of the current draw for non-slewing conditions being small the large signal stage is power efficient. Thus, the transconductance of the large signal stage, magnitude of the output current, current gain, and power efficiency can all be configured for providing optimal large signal operation emphasizing either extended linear dynamic range or slew rate and power efficiency.

$D_5$ or $D_6$ may be included in the active loads to help stabilize the active load transistors $Q_{13}$ and $Q_{14}$ respectively, when the circuit is operated in high ambient temperatures. Similarly, $D_3$ and $D_4$ which are connected to the emitters of $Q_{21}$ and $Q_{24}$ respectively, help provide the necessary base-collector voltage to $Q_{19}$ and $Q_{22}$ respectively, at high ambient temperatures.

Figure 2:
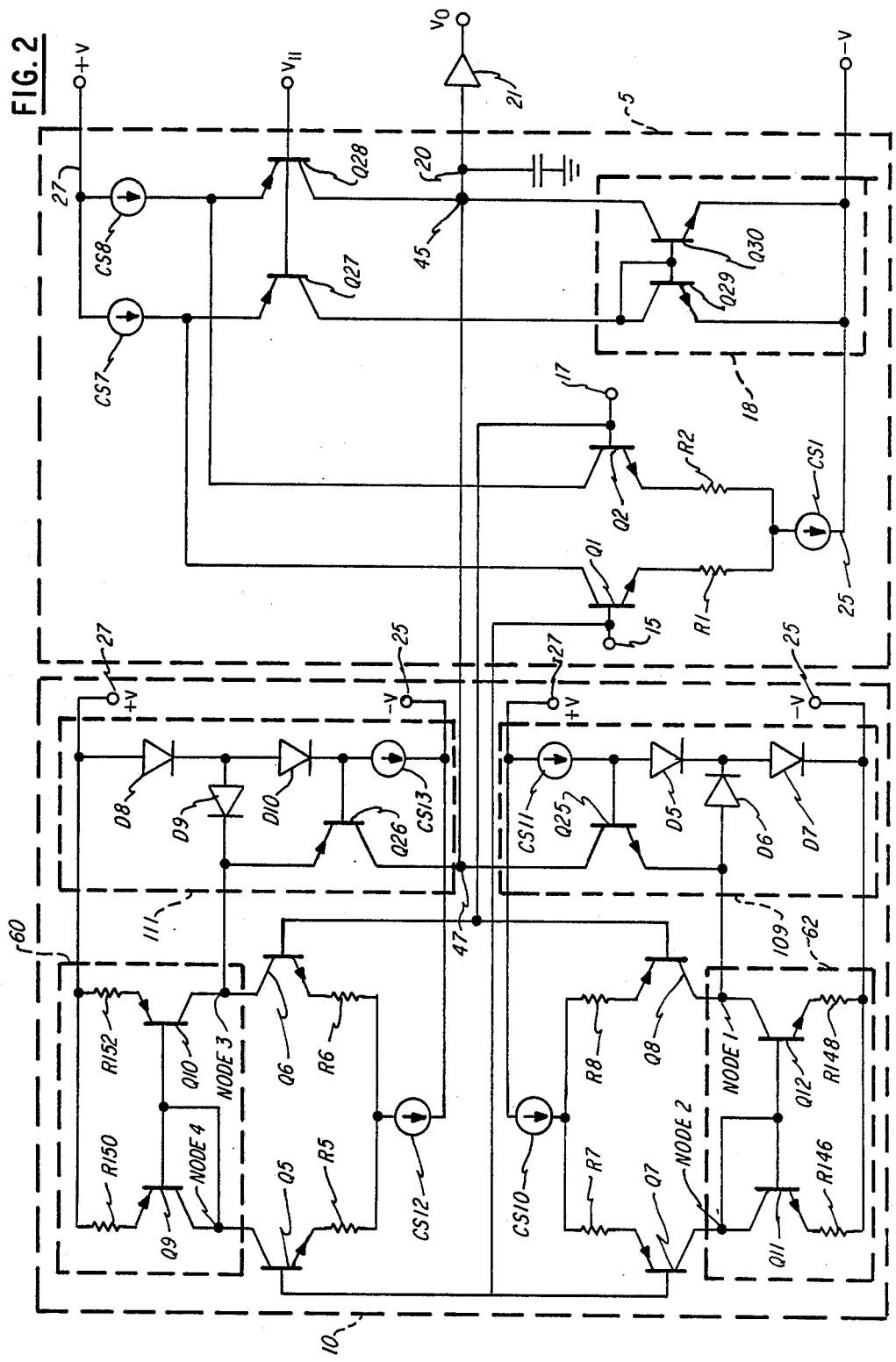
FIG. 2 represents a schematic design of another embodiment of the slew enhancement stage in parallel with a normal front end stage incorporating the principles of the present invention.

Referring to FIG. 2, another embodiment of the invention similar to the previous figure, shows a front end of an operational amplifier 5 in parallel with a slew enhancement or large signal stage 10. The combined stages have two input terminals as in FIG. 1 designated as positive 15 and negative 17. The circuit also has summing nodes 45 and 47, each communicating with the other to form a single output 20, whereby current will either flow into the output 20 from a buffer stage 21 or will flow out at the output 20 into the buffer stage 21. The direction of the current as with the previous embodiment, depends upon the polarity of the input differential voltage at 15 and 17.

The small signal stage 5 includes a differential transistor pair consisting of two NPN transistors $Q_1$ and $Q_2$. The positive input 15 is connected to the base of $Q_1$ and the negative input 17 is connected to the base of $Q_2$. Resistors R1 and R2 are coupled between the emitters of $Q_1$ and $Q_2$ respectively, and the lower supply rail 25 via current source CS1. The collector of $Q_1$ is connected to current source CS7 and to the emitter of output transistor $Q_{27}$, while the collector of $Q_2$ is connected to the current source CS8 and the emitter of output transistor $Q_{28}$. The current sources should be closely matched such that offset voltages of the small signal stage 5 are minimized. $Q_{27}$ and $Q_{28}$ are PNP transistors, with their collectors being connected to the input and output sides of current mirror 18 respectively. $Q_{27}$ and $Q_{28}$ are biased with a constant supply source at their bases by $V_B$. The current mirror 18 comprises of NPN transistors $Q_{29}$ and $Q_{30}$ with a short applied between the collector of $Q_{29}$ and the bases of both $Q_{29}$ and $Q_{30}$.

As with the first embodiment, the large signal stage 10 includes an input stage comprising of two differential transistor pairs; one pair of NPN transistors, $Q_5$ and $Q_6$, and another pair of PNP transistors, $Q_7$ and $Q_8$. The positive input terminal 15 is coupled to the bases of complementary transistors $Q_5$ and $Q_7$, with the negative terminal 17 coupled to the bases of complementary transistors $Q_6$ and $Q_8$. These inputs are in turn connected in parallel to the inputs of the small signal stage 5. Current sources CS10 and CS12 provide bias current for the respective differential pairs.

Transistor pair $Q_5$ and $Q_6$ have their emitters coupled together via resistors R5 and R6, with the common node coupled to the lower supply rail 25 via current source CS12. Similarly, transistor pair $Q_7$ and $Q_8$ have their emitters coupled together via resistors R7 and R8, with the common node coupled to the upper supply rail 27 via current source CS10. The ratios of resistor pairs R5, R6 and R7, R8 provide the means for setting the transconductance of the respective complementary sections of the large signal stage. Active loads 60 and 62 are coupled between the output collector legs of the differential transistor pairs. The active loads include current mirrors comprised of either a PNP transistor pair $Q_9$ and $Q_{10}$ or a NPN transistor pair $Q_{11}$ and $Q_{12}$, the former being coupled to the NPN differential pair $Q_5$ and $Q_6$, and the latter being coupled to the PNP differential pair $Q_7$ and $Q_8$. Coupled between the emitters of $Q_{11}$ and $Q_{12}$ and the power supply rail 25 are resistors R146 and R148 respectively. Similarly, coupled between the emitters of $Q_9$ and $Q_{10}$ and the power supply rail 27 are resistors R150 and R152. The ratio of these resistances and the ratio of the respective emitters allow for the setting of the large signal current gain. The outputs of the active loads 60 and 62 are connected to the respective inputs of the output stages 111 and 109.

The upper output stage 111 includes diodes, $D_8$, $D_9$, $D_{10}$ and PNP transistor $Q_{26}$. The cathode of $D_8$ is connected to the upper supply rail 27, with the anode of $D_8$ being connected to the cathode of $D_9$ and the anode of $D_{10}$. $D_9$ and $D_{10}$ form a bridge across the base-emitter of transistor $Q_{26}$, with the base of $Q_{26}$ and anode of $D_3$ being connected to the lower supply rail 25 via current source CS13. The emitter of $Q_{26}$ is coupled to the anode of $D_9$ and the output of the active load 60. The collector of $Q_{26}$ is connected to output 20 via the summing nodes 45 and 47.

The lower output stage 109 includes diodes $D_5$, $D_6$, $D_7$ and NPN transistor $Q_{25}$. The anode of $D_7$ is connected to the lower supply rail 24 with the cathode of $D_7$ being connected to the anodes of $D_5$ and $D_6$. $D_5$ and $D_6$ form a bridge across the base-emitter of transistor $Q_{25}$, with the base of $Q_{25}$ and cathode $D_5$ being connected to the upper supply rail 27 via current source CS11. The emitter of $Q_{25}$ is coupled to the cathode of $D_6$ and the output of the active load is 62. The collector of $Q_{25}$ is connected to output 20 via the summing nodes 45 and 47.

As a more positive potential is applied to the input terminal 17 with respect to terminal 15, $Q_2$ of the small signal stage 5 is biased on more than $Q_1$ resulting in current being drawn from current source CS8 to $Q_2$ leaving little current remaining to flow through output transistor $Q_{28}$. Because $Q_1$ is biased off more, thereby conducting less current, current from current source CS7 will flow through output transistor $Q_{27}$ and into the input leg of the current mirror 15. This produces a reflected current in the output leg of the mirror, thereby providing a current sink for the output 20 of the circuit.

When a more positive potential is applied to the input terminal 15 with respect to terminal 17, $Q_2$ begins to turn off more with $Q_1$ biased to conduct more. This results in current being drawn from current source CS7 to $Q_1$, leaving little current remaining to flow through $Q_{27}$. With $Q_{27}$ supplying less current to the input leg of the current mirror, less current will therefore, be reflected in the output leg of the mirror as well.

Because $Q_2$ is biased to conduct less, with this polarity of differential input voltage, current from current source CS8 will be drawn through $Q_{28}$ instead of $Q_2$. As the differential input voltage is increased more, less current is drawn in the output leg of the current mirror 15, with more current thereby flowing to the output 20 from $Q_{28}$. However, upon a sufficient voltage magnitude at the small signal stage inputs, the small signal stage output current will equal that of the current sources CS7 and CS8 and slew rate limiting occurs. It is at this point the large signal stage begins to provide additional slew current.

With regard to the upper half of the large signal stage, transistors $Q_5$, $Q_6$, $Q_9$, $Q_{10}$ and resistors $R_5$ and $R_6$ of the active load 60 have values set so that under small signal conditions, the collector current of $Q_6$ is greater than the emitter current of $Q_{10}$. The difference in these currents causes node 3 to fall in voltage until the diode $D_9$ clamps it. When node 3 is clamped, transistor $Q_{26}$ of the output stage 111 will be off, thereby contributing no current to the output 20 of the circuit. A similar set up and response exists for active load 62 and output stage 109.

As the voltage becomes sufficiently more positive at input terminal 15 with respect to input terminal 17, $Q_6$ will be biased off sufficiently such that the current through $Q_{10}$ will equal or exceed the current through $Q_6$. When this occurs, the potential at node 3 will rise until the emitter of $Q_{26}$ conducts and the difference in current between $Q_{10}$ and $Q_6$ will flow through $Q_{26}$ and to the output 20 of the circuit via summing means 45 and 47, where it will add to the current supplied by the small signal stage 5. As a result of the PNP configuration of the lower half of the large signal stage, when the potential becomes more positive at input 15 with respect to input 17, the differential pair $Q_7$ and $Q_8$ will bias the active load 62 such that the active load will prevent the output stage 109 from contributing current to output 20, by biasing $Q_{25}$ off.

When the input terminal 17 increases sufficiently more positive than input terminal 15, the lower half of the large signal stage conducts current to it from the output 20, while the upper half now remains off. As a result of this polarity of input voltage, $Q_7$ is biased on more than $Q_8$. The current of $Q_7$ flows into the active load current mirror transistor $Q_{11}$ causing a reflected current in $Q_{12}$, with the difference in current flowing to the output of the mirror at node 1.

The input voltage at which $Q_{12}$ current equals $Q_8$ current is the large signal stage threshold voltage for the lower complementary section, while the input voltage at which $Q_{10}$ equals $Q_6$ is the threshold voltage for the upper section. The threshold is determined by the selection of the respective emitter ratios of $Q_7$, $Q_8$ and $Q_5$, $Q_6$, the respective resistor ratios of $R_7$, $R_8$ and $R_5$, $R_6$, and the respective emitter ratios of $Q_{11}$, $Q_{12}$ and $Q_9$, $Q_{10}$. Typically by way of example, $R_7$ will be greater than $R_8$, and $Q_{12}$ emitter area will be greater than the emitter area of $Q_{11}$. The circuit designer can thus set the threshold voltage to match the slew rate limit point of the small signal stage and as with first preferred embodiment, set the transconductance to be the same as that of the small signal stage for providing an extended input dynamic range. Alternatively, the current sources CS10 and CS12 can be made small for attaining power efficiency. Additionally, the current mirror ratio can also be made large to provide a high slew rate, thereby optimizing large signal stage operation. Because the large signal stage is only providing slew current when large signal operation is required, the small signal stage can also be optimized for small signal operations without being detrimentally influenced by the parallel large signal stage.

Figure 3:
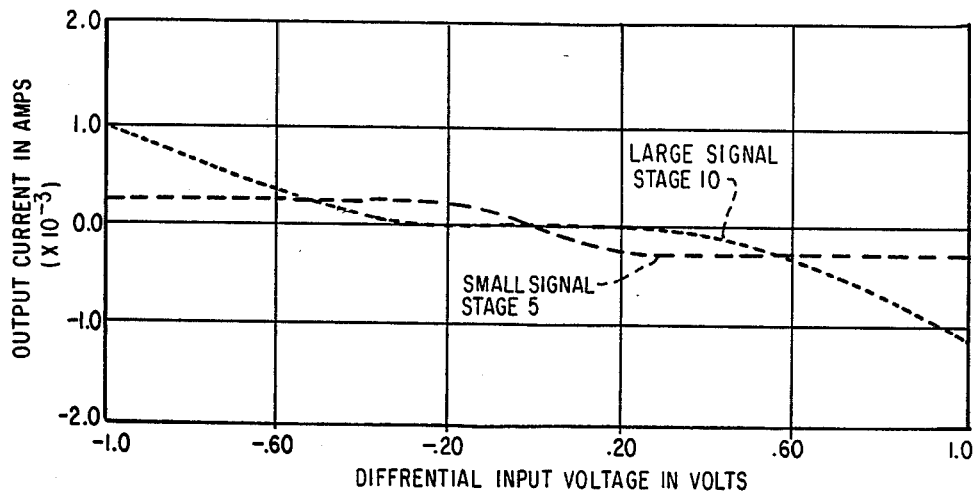
FIG. 3 is a graphical representation of the separate transfer characteristics of the small signal stage and the slew enhancement stage.

FIG. 3 graphically shows the transfer characteristics of both the small signal stage 5 and the large signal stage 10 emphasizing the extended input linear dynamic range. For the type of amplifier described in FIG. 1, the output of the small signal stage 5 responds approximately linearly for a small signal differential input of approximately between +0.20 volts. During this range, the output of the large signal stage 10 is zero representing the "dead zone", by which the high gain current mirrors are biased off.

For differential voltages greater than +0.20 volts, slew rate limiting occurs with the small signal stage 5 and no additional current is produced from this stage with any further increase in differential input voltage as shown in the Figure. The large signal stage 10, however, begins to conduct supplying an output current that linearly reflects the differential input voltage.

Figure 4:
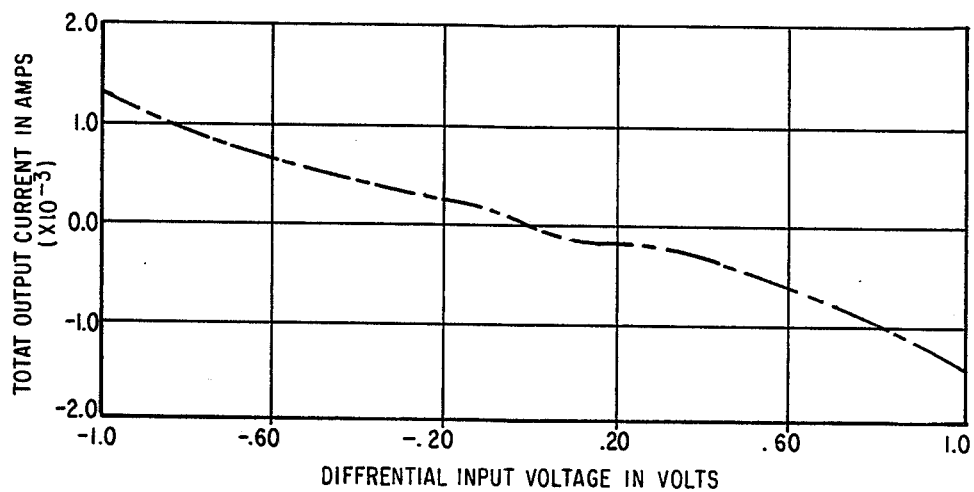
FIG. 4 is a graphical representation of the transfer characteristics of the improved circuit, showing the combined output current supplied by both the small signal stage and the large signal stage.

FIG. 4 graphically shows the transfer characteristics of the improved amplifier circuit representing the summation of the output currents of both the small signal stage 5 and large signal stage 10 emphasizing the extended linear dynamic range.

From the preceding description of the preferred embodiments, it is evident that the objects of the invention are attained, and although the invention has been described and illustrated in detail, it is to be clearly understood that the same is by way of illustration and example only and is not to be taken by way of limitation. An example of this is the use of other types of transistors other than bipolars. Therefore, the spirit and scope of the invention are to be limited only by the terms of the appended claims.

What is claimed is:

1. In an amplifier circuit having an input and output stage, said circuit comprising:
    a small signal stage arranged in said input stage and having a transconductance for providing an output current in response to a small signal differential input voltage;
    a large signal stage arranged in said input stage and connected electrically in parallel with said small signal stage for providing additional current when said differential input voltage reaches a selected threshold, said large signal stage having a transconductance which is substantially the same in magnitude as the transconductance of said small signal stage; and
    summing means coupled between the outputs of said small signal stage and said large signal stage for providing a combined output current to said output stage of said amplifier circuit.

2. The circuit of claim 1, wherein said selected threshold voltage is the input voltage at which the small signal stage begins to slew rate limit.

3. The circuit of claim 1, wherein said large signal stage includes a means for providing current gain.

4. The circuit of claim 1, wherein said small signal stage includes a first internal biasing current source means having a first fixed magnitude and said large signal stage includes a second internal biasing current source means having a second fixed magnitude.

5. The circuit of claim 4, wherein said combined output currents of said small and large signal stages are greater in magnitude than the sum of said first and second magnitudes of said first and second internal biasing current source means.

6. The circuit of claim 1, wherein said small signal stage includes a differential pair of transistors and first output means coupled between said differential pair and said summing means.

7. The circuit of claim 6, wherein said large signal stage includes two differential transistor pairs each having two inputs and two outputs, said transistor inputs connected in parallel to a corresponding like pair of inputs of said small signal stage.

8. The circuit of claim 7, wherein said large signal stage further includes a second output means connected between respective said differential transistor pairs and said summing means, wherein means for providing current gain includes current mirror means, said current mirror means being connected between respective said differential transistor pairs and said output stage.

9. In an amplifier circuit having an input and an output stage, said circuit comprising:
a small signal transconductance stage in said input stage for providing an output current in response to a differential input voltage, said response producing a first slew rate;
a large signal transconductance stage connected electrically in parallel with said small signal transconductance stage for providing current only in response to said input differential voltage when said differential voltage reaches a selected threshold, said response producing a second slew rate, said second slew rate being faster than said first slew rate, and
summing means coupled between the outputs of said small signal transconductance stage and said large signal transconductance stage for providing a combined output current to said output stage.

10. The circuit of claim 9, wherein said selected threshold voltage is the input voltage at which the small signal transconductance stage begins to slew rate limit.

11. The circuit of claim 9, wherein said large signal stage includes a means for providing current gain.

12. The circuit of claim 9, wherein said small signal stage includes a first internal biasing current source means having a first fixed magnitude and said large signal stage includes a second internal biasing current source means having a second fixed magnitude.

13. The circuit of claim 12, wherein said combined output current is greater in magnitude than the sum of said first and second fixed magnitudes of said first and second internal biasing current source means.

14. In an amplifier circuit having an input and an output stage, said circuit comprising:
a small signal stage in said input stage for providing an output current in response to a small signal differential input voltage, said small signal stage including a first internal biasing current source means having a first fixed magnitude;
a power efficient large signal stage connected electrically in parallel with said small signal stage for providing additional slew current only when said differential input voltage to said parallel stages reaches a specified value, said large signal stage including a second internal biasing current source means having a second fixed magnitude, wherein said additional slew current is greater in magnitude than the current available from said second internal biasing current source means; and
summing means coupled between the outputs of said small signal stage and said large signal stage for providing a combined output current to said output stage.

15. The circuit of claim 14, wherein said specified value is at least the input voltage at which the small signal stage begins to slew rate limit.

16. The circuit of claim 14, wherein said large signal stage includes a means for providing current gain.

* * * * *